(12) United States Patent
Smith, III et al.

(10) Patent No.: US 12,073,172 B2
(45) Date of Patent: Aug. 27, 2024

(54) ENCODED STRING PROCESSING

(71) Applicant: MICRO FOCUS LLC, Santa Clara, CA (US)

(72) Inventors: Philip Hillyer Smith, III, Santa Clara, CA (US); Richard Todd Minner, Santa Clara, CA (US)

(73) Assignee: Micro Focus LLC, Santa Clara, CA (US)

( * ) Notice: Subject to any disclaimer, the term of this patent is extended or adjusted under 35 U.S.C. 154(b) by 199 days.

(21) Appl. No.: 17/878,187

(22) Filed: Aug. 1, 2022

(65) Prior Publication Data
US 2024/0037318 A1  Feb. 1, 2024

(51) Int. Cl.
*G06F 40/126* (2020.01)
*H03M 7/30* (2006.01)

(52) U.S. Cl.
CPC ......... *G06F 40/126* (2020.01); *H03M 7/6011* (2013.01); *H03M 7/705* (2013.01)

(58) Field of Classification Search
CPC .... G06F 40/126; H03M 7/6011; H03M 7/705
USPC ........................................................ 341/50–51
See application file for complete search history.

(56) References Cited

U.S. PATENT DOCUMENTS

| | | | |
|---|---|---|---|
| 7,982,637 B2 * | 7/2011 | Joyce | G06F 40/126 715/264 |
| 10,089,281 B1 * | 10/2018 | Neumann | G06F 16/24535 |
| 2016/0099724 A1 | 4/2016 | Dossev | |

* cited by examiner

*Primary Examiner* — Khai M Nguyen
(74) *Attorney, Agent, or Firm* — Sheridan Ross P.C.

(57) ABSTRACT

A pointer is set to a first code unit of an original string that encodes characters via code units within an encoding scheme. Whether the code unit of the original string referenced by the pointer is valid within the encoding scheme is determined. If the code unit referenced by the pointer is valid, one or more code units of the original string that encode a single character within the encoding scheme are processed, starting at the code unit referenced by the pointer. The one or more code units as have been processed are appended to a processed string. A single shadow unit indicating that the one or more code units that have been processed are valid is appended to a shadow array. The pointer is advanced to the code unit of the original string following the one or more code units.

20 Claims, 8 Drawing Sheets

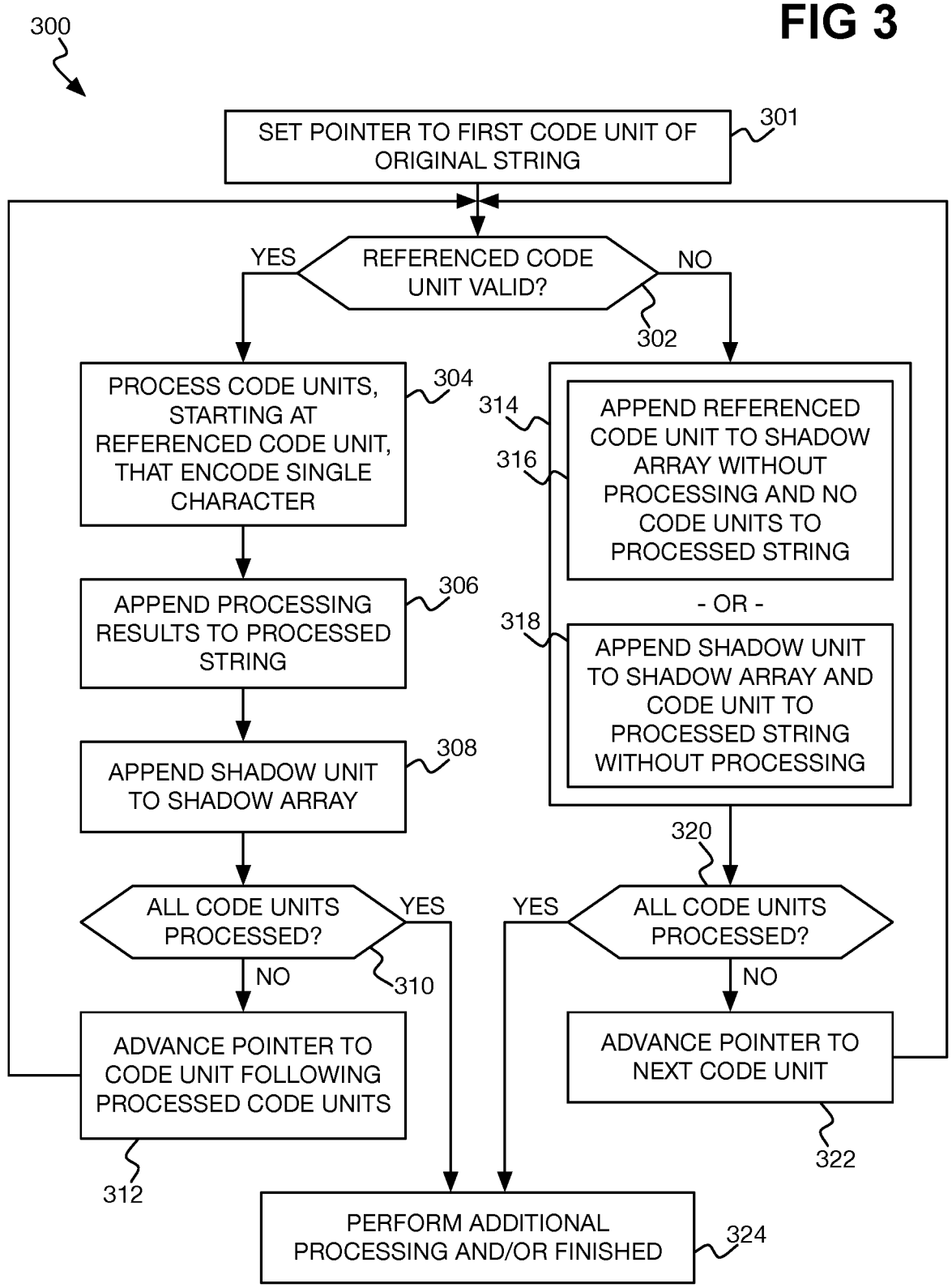

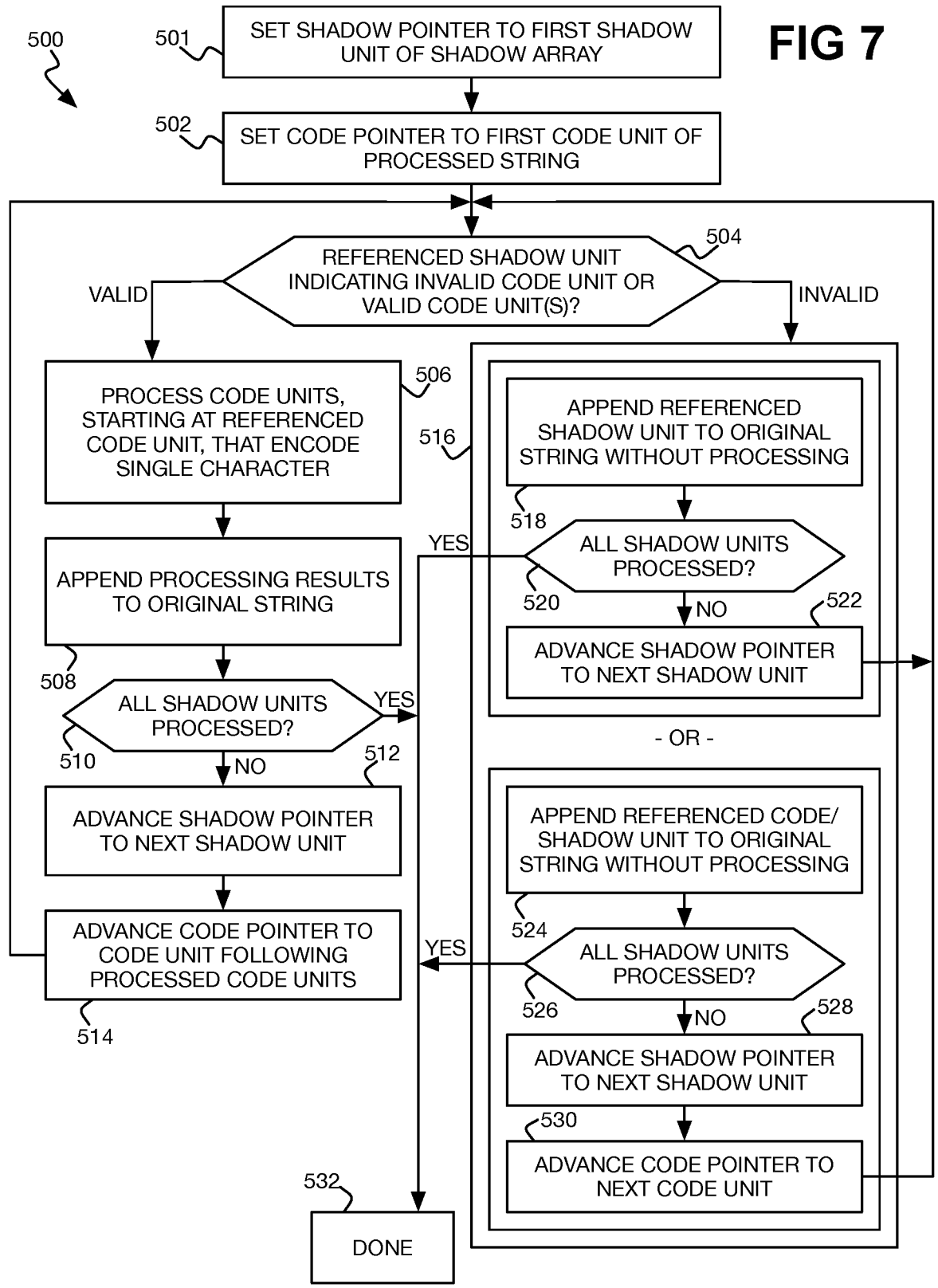

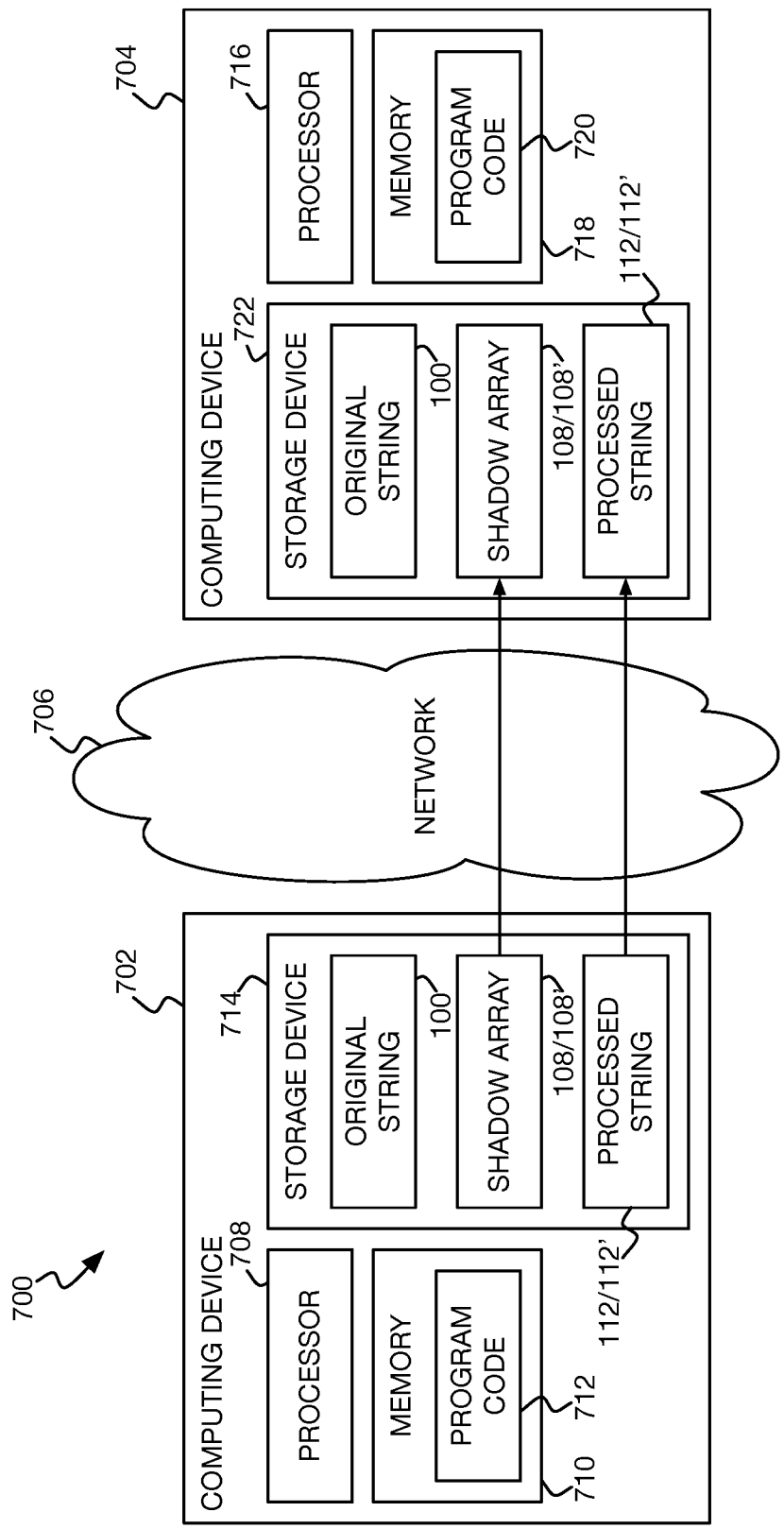

ENCODED STRING PROCESSING

BACKGROUND

Computing systems, including computing devices such as computers, smartphones, tablet computing devices, and other types of computing devices, can display and print information for users in the form of characters. A character is a unit of information that corresponds to a grapheme or symbol. Examples of characters include letters in various human languages, numerical digits, punctuation marks, and whitespace, as well as control characters like carriage returns and tabs. More recent examples of characters include emoji. A series of characters is considered a string.

BRIEF DESCRIPTION OF THE DRAWINGS

FIG. 3 is a flowchart of an example method for processing an original string to generate a shadow array and a processed string.

FIG. 7 is a flowchart of an example method for processing a shadow array and a processed string to reconstruct an original string.

FIG. 9 is a diagram of an example system in which a computing device generates a processed string and a shadow array from an original string, and in which another computing device reconstructs the original string from the processed string and the shadow array.

DETAILED DESCRIPTION

Figure 1:
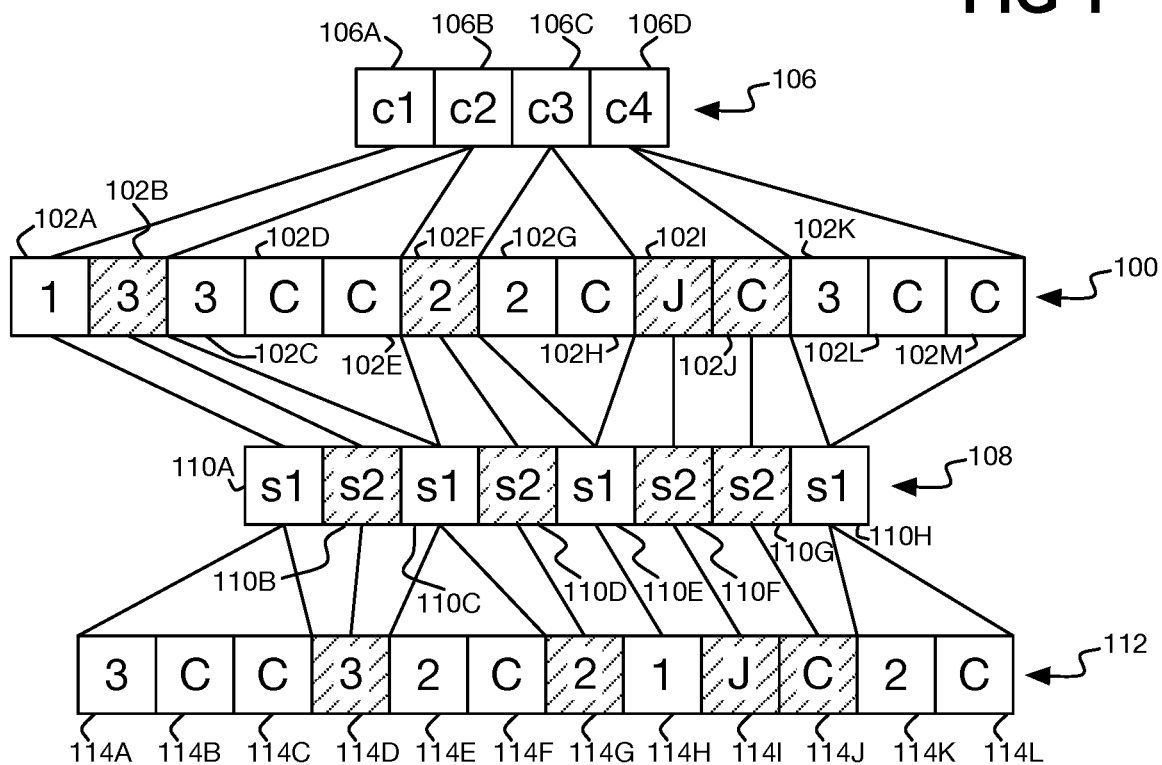
FIG. 1 is a diagram of an example original string encoding characters, an example shadow array corresponding to the original string, and an example processed string corresponding to the original string.

As noted in the background, a character is a unit of information that corresponds to a grapheme, or symbol. Character encoding is the process of assigning numbers to characters for storage, transmission, and transformation in and by computing systems. The numerical value or values representing a character in an encoding can be referred to as a code point, and the collection of the numerical values for an entire set of characters in an encoding may be referred to as a code space, a code page, or a character map.

One of the first character encoding standards was the American Standard Code for Information Interchange (ASCII) standard, in which seven bits are used to encode a total of 128 characters. More recently, the Unicode Consortium, legally known as Unicode, Inc., non-profit organization based in Mountain Valley, Calif., has promulgated different Unicode Transformation Formats (UTFs), which are in practice variable-byte length (in that the number of bytes encoding each character is not static) and/or multiple-byte length encodings (in that more than one byte is used to encode each character) to represent a larger number of characters.

For example, UTF-8 encoding uses between one and four eight-bit bytes to represent a character. The first 128 characters are each encoded by a single byte having a most significant bit of zero, with the remaining seven bits identical to the ASCII encoding of that character. A character encoded by two bytes has a first byte beginning with 110 as its most significant bits, and a second, continuation byte beginning with 10 as its most significant bits. A character encoded by three bytes has a first byte beginning with 1110 as its most significant bits, and second and third continuation bytes that each begin with 10 as its most significant bits. A character encoded by four bytes has a first byte beginning with 11110 as its most significant bits, and second, third, and fourth continuation bytes that each begin with 10 as its most significant bits. No character is defined in UTF-8 encoding that has a first byte beginning with 11111 as its most significant bits.

UTF-8 encoding therefore employs code units that are each the same size in length, namely a single eight-bit byte, where each character is represented by one, two, three, or four such code units. Other encodings use code units that are also each the same size in length, but may be more than one eight-bit byte. For example, UTF-16 encoding employs code units that are each two eight-bit bytes in length, and each character is represented by one or two such code units. Other encodings include UTF-32, double-byte character sets, and the Shift Japanese Industrial Standards (Shift JIS) encodings, among others.

Unlike strings representing characters with ASCII encoding, strings that represent characters with UTF-8 or UTF-16, as well as other encodings, can include invalid code units. For example, every code unit of seven bits maps to a valid character in ASCII. By comparison, a code unit beginning with the most significant bits 11111 does not map to any valid character in UTF-8. Furthermore, a code unit beginning with the most significant bits 1110 must be followed by two code units that each begin with the most significant bits 10 in UTF-8, or else it is invalid. Similarly, a code unit beginning with the most significant bits 10 and not immediately preceded by a code unit beginning with the most significant bits 11110, 1110, 110, or 10 is necessarily invalid in UTF-8.

Characters are encoded in strings to aid in their manipulation in computing systems. Stated another way, character encoding is a technological construct for utilization in computing systems. Apart from computing systems, there is no need to encode characters, and prior to computing systems characters were not encoded for processing. When using pencil and paper, for instance, a character can simply be written as a grapheme or symbol. Computing systems require character encodings because they are digital in nature, and therefore must represent a grapheme or symbol (viz., a character) using a series of bits.

Encoding characters within a string via an encoding scheme such as UTF-8 permits a computing system to store, transmit, and transform the string, as noted. For example, a UTF-8-encoded string may be transformed prior to transmission or storage. Such string transformation, which is an example of string processing, is problematic if the sequence of code units of the string is not completely valid. For example, during transmission, one or multiple code units of a string may become corrupted (e.g., changed in value) or be dropped, or code units may be incorrectly duplicated or added within the string.

Before processing an encoded string, therefore, the string may be examined to ensure that all its code units are valid. A string having any invalid code unit may itself be considered as invalid, and the string not processed. However, such a technique is ill suited for long strings in which the vast majority of the code units are valid. Discarding an entire such string as invalid results in the loss of the information that the properly encoded characters within the string represent. Similarly, if the processing is performed to protect a string, not processing the string due to the presence of one or more invalid code units risks leaving potentially confidential information unprotected and vulnerable to nefarious capture.

In another approach, valid code units of a string may be processed, with the invalid code units discarded. This approach preserves as much information as possible that is encoded within the string, but removes logical positional information from the string, which can be undesirable. For example, a UTF-8-encoded string may have a character encoded by three valid code units, followed by an invalid code unit, which is then followed by a character encoded by two valid code units. The two validly encoded characters are thus logically separated in position by an invalid code unit.

It is noted in this respect that the logical position of a character within a string can differ from the physical position of a character within the string in variable-length encodings. For example, the first character of a string may be encoded by two code units, whereas the second character may be encoded by three code units. The characters have logical positions of one and two, respectively. However, while the first character has a physical position of one (or both one and two) since it starts at the first code unit of the string, the second character has a physical position of three (or three, four, and five) since it starts at the third code unit of the string.

Discarding the invalid code unit during processing in an example string in which two validly encoded characters are separated by an invalid code unit means that the logical positional information of the two validly encoded characters is lost. Instead of being at non-adjacent, first and third logical positions, the characters are now logically positioned adjacent to one another at first and second positions within the processed string. Moreover, discarding the invalid code unit means that any potentially recoverable information represented in that code unit (e.g., information as to confusion regarding the encoding scheme that was actually used) is irretrievably lost. Subsequent processing of the processed string in an attempt to recover the lost information will never be successful, since the invalid code unit is not preserved.

Techniques described herein ameliorate these and other issues. In the techniques described herein, when an original string undergoes processing, logical positional information of the code units of the original string is retained, as are invalid code units. The techniques generate both a processed string and what is referred to as a shadow array from an original string encoding characters in UTF-8 or another encoding. The shadow array retains positional information of the encoded characters and the invalid code units of the original string. Either or both of the shadow array and the processed string retain the invalid code units themselves. As a result, the original string, including the invalid code units and the logical positional information of all the code units, can still be reconstructed or recovered using the shadow array and the processed string.

The techniques are described herein in relation to UTF-8 encoding. However, the techniques are applicable to any other character encoding that is variable length and/or that do not have valid character encodings for every possible combination of code units. UTF-8 encoding is both variable length and does not have a valid character encoding for any code unit beginning with the most significant bits 11111, as one example. UTF-16 encoding is variable length.

FIG. 1 shows an example original string 100 having code units 102A, 102B, 102C, 102D, 102E, 102F, 102G, 102H, 102I, 102J, 102K, 102L, and 102M, which are collectively referred to as the code units 102, and via which characters 106, including characters 106A, 106B, 106C, and 106D, are encoded in UTF-8. Valid code units 102A, 102C, 102D, 102E, 102G, 102H, 102K, 102L, and 102M are indicated with no shading in the figure, whereas invalid code units 102B, 102F, 102I, and 102J are indicated with shading. The code units 102 are each processed individually or in conjunction with subsequent code units 102 to determine their validity.

The code unit 102A is depicted as "1" in the example to indicate that it begins with the most significant bit 0, and therefore by itself validly encodes a character. The validity of the code unit 102A as such does not depend on any following code unit. The code unit 102A in particular is a single code unit encoding of the character 106A, which is depicted as "c1" in the example.

The code unit 102B is depicted as "3" in the example, which means that the code unit 102B has the most significant bits 1110. Therefore, the code unit 102B is valid if (and only if) it is followed by two code units 102C and 102D that each begin with the most significant bits 10 such that the tuple of three code units 102B, 102C, and 102D together encode a character. However, the code unit 102C is also depicted as "3" in the example, which means that the code unit 102C has the most significant bits 1110 as well, and therefore the code unit 102B is invalid.

As noted, the code unit 102C is depicted as "3" in the example, meaning that the code unit 102C has the most significant 1110. Therefore, the code unit 102C is valid if (and only if) it is followed by two code units 102D and 102E that each begin with the most significant bits 10 such that the tuple of three code units 102C, 102D, and 102E together encode a character. The code units 102D and 102E are each indicated as "C" in the example, which means that each indeed has the most significant bits 10, and are thus continuation code units of a multiple code unit-encoded character. Therefore, the code units 102C, 102D, and 102E are all valid, and in particular are a three code unit encoding of the character 106B, which is depicted as "c2" in the example.

The code unit 102F is depicted as "2" in the example, which means that the code unit 102F has the most significant bits 110. Therefore, the code unit 102F is valid if (and only if) it is followed by a code unit 102G that begins with the most significant bits 10 such that the pair of code units 102F and 102G together encode a character. However, the code unit 102G is also depicted as "2" in the example, which means that the code unit 102G has the most significant bits 110 as well, and therefore the code unit 102F is invalid.

As noted, the code unit 102G is depicted as "2" in the example, meaning that the code unit 102G has the most significant bits 110. Therefore, the code unit 102G is valid if (and only if) it is followed by a code unit 102H that begins with the most significant bits 10 such that the pair of code units 102G and 102H together encode a character. The code unit 102H is indicated as "C" in the example, which means that it indeed has the most significant bits 10. Therefore, the code units 102G and 102H are both valid, and in particular are a two code unit encoding of the character 106C, which is depicted as "c3" in the example.

The code unit 102I is depicted as "J" in the example, which means that the code unit 102I has the most significant bits 11111. Because a code unit in UTF-8 cannot begin with these most significant bits, the code unit 102I is invalid. The code unit 102J is depicted as "C" in the example, which means that the code unit 102J has the most significant bits 10. The code unit 102J is valid only if it is preceded by a code unit 102H having the most significant bits 110; if it is preceded by a code unit 102H also having the most significant bits 10 and a code unit 102G having the most significant bits 1110; or if it is preceded by two code units 102H and 102G that each have the most significant bits 10 and a code unit 102F having the most significant bits 11110. Because none of these conditions is true, the code unit 102J is invalid.

The code unit 102K is depicted as "3" in the example, meaning that the code unit 102K has the most significant bits 1110. Therefore, the code unit 102K is valid if (and only if) it is followed by two code units 102L and 102M that each begin with the most significant bits 10 such that the tuple of three code units 102K, 102L, and 102M together encode a character. The code units L and 102M are each indicated as "C" in the example, which means that each indeed has the most significant bits 10. Therefore, the code units 102K, 102L, and 102M are all valid, and in particular are a three code unit encoding of the character 106D, which is depicted as "c4" in the example.

A shadow array 108 can be generated that corresponds to the original string 100. The shadow array 108 has shadow units 110A, 110B, 110C, 110D, 110E, 110F, 110G, and 110H, which are collectively referred to as the shadow units 110, and that each correspond to a tuple of one, two, three, or four code units 102 of the original string 100 that validly encode one of the characters 106, or to an invalid code unit 102. The shadow units 110A, 110C, 110E, and 110H that correspond to valid tuples of one, two, three, or four code units 102 are indicated without shading. The shadow units 110B, 110D, 110F, and 110G that each correspond to an invalid code unit 102 are indicated with shading.

In the example implementation, each shadow unit 110 may have a first prespecified shadow unit having a value of "s1", indicating that it corresponds to a tuple of one, two, three, or four code units 102 that validly encode one of the characters 106, or a second prespecified shadow unit having a value of "s2", indicating that it corresponds to an invalid code unit 102. In this case, each shadow unit 110 does not encode the values of its corresponding valid tuple of code units 102 or the value of its corresponding invalid code unit 102. That is, the values of the valid tuple of code units 102 or the value of the invalid code unit 102 to which a shadow unit 102 corresponds cannot be recovered from the value of the shadow unit 102 itself. The shadow units 110 may each be equal in size, and may each be equal or smaller in size as compared to the size of each code unit 102 of the string 100. For example, the value of "s1" might be a single bit of value zero, whereas the value of "s2" might be the single bit of value one.

The shadow array 108 preserves the logical positional information of the original string 100 as to the characters 106 encoded within the string 100 in relation to one another and to the invalid code units 102B, 102F, 102I, and 102J of the string 100. For instance, the shadow unit 110A corresponds to the code unit 102A that validly encodes the character 106A, and is followed by a shadow unit 110B that corresponds to the invalid code unit 102B. The shadow unit 110C corresponds to the code units 102C, 102D, and 102E that validly encode the character 106B, and follows the shadow unit 110B.

The shadow unit 110D follows the shadow unit 110C, and corresponds to the invalid code unit 102F. The shadow unit 110E follows the shadow unit 110D, and corresponds to the code units 102G and 102H that validly encode the character 106C. The shadow unit 110F follows the shadow unit 110E, and corresponds to the invalid code unit 102I. The shadow unit 110G follows the shadow unit 110F, and corresponds to the invalid code unit 102J. The shadow unit 110H follows the shadow unit 110G, and corresponds to the valid code units 102K, 102L, and 102M that validly encode the character 106D.

The shadow array 108 therefore has logical positional correspondence with the original string 100. That is, the logical position of each shadow unit 110 within the shadow array 108 (relative to the other shadow units 110) corresponds to the logical position of a corresponding character 106 as validly encoded within the string 100 or of a corresponding invalid code unit 102 within the string 100 (relative to the other characters 106 validly encoded within the string 100 and the other invalid code units 102 of the string 100).

For example, the shadow unit 110C is the third shadow unit of the shadow array 108, and is between the second shadow unit 110B and the fourth shadow unit 110D. The shadow unit 110C corresponds to the character 106B validly encoded by the code units 102C, 102D, and 102E within the string 100. The character 106B is positioned between the invalid code unit 102B to which the second shadow unit 110B corresponds, and the invalid code unit 102F to which the fourth shadow unit 110D corresponds.

The shadow array 108 does not have physical position correspondence with the original string 100. That is, the physical position of each shadow unit 110 within the shadow array 108 (relative to the other shadow units 110) does not correspond to the physical position of a corresponding character 106 as validly encoded within the string 100 or of a corresponding invalid code unit 102 within the string 100 (relative to the other characters 106 validly encoded within the string 100 and the other invalid code units 102 of the string 100).

For example, the shadow unit 110E is the fifth shadow unit of the shadow array 108, and may be the fifth bit of the array 108 in the implementation in which each shadow unit 110 is a single bit. However, the corresponding character 106C is validly encoded by the code units 102G and 102H, which are the seventh and eighth code units of the original string 100. Therefore, there is no physical position correspondence between the shadow array 108 and the string 100.

Along with the shadow array 108, a processed string 112 can be generated that also corresponds to the original string 100. The processed string 112 has code units 114A, 114B, 114C, 114D, 114E, 114G, 114H, 114I, 114J, 114K, and 114L, which are collectively referred to as the code units 114. The code units 114 may be of the same size as or a different size than the code units 102 of the original string 100. The processed string 112 may encode a converted version (such as an encrypted version) or the same version of the characters 106 as the original string 100, using the same or different encoding scheme.

The processed string 112 has at least code units 114 encoding versions of the characters 106 that are validly encoded within the original string 100, in the same logical order as in the string 100, and which are indicated without shading. The characters 106 encoded within the original string 100 can be recovered from these code units 114 of the processed string 112. The code units 114A, 114B, and 114C of the processed string 112 correspond to the shadow unit 110A, and encode the same or different version of the character 106A that the code unit 102A of the original string 100 to which the shadow unit 110A corresponds does. In the processed string 112, more code units are thus used to encode the character 106A than in the original string 100.

The code units 114E and 114F correspond to the shadow unit 110C, and encode the same or different version of the character 106B that the code units 102C, 102D, and 102E to which the shadow unit 110C corresponds does. The code unit 114H corresponds to the shadow unit 110E, and encodes the same or different version of the character 106C that the code units 102G and 102H to which the shadow unit 110E correspond does. The code units 114K and 114L correspond to the shadow unit 110H, and encode the same or different version of the character 106D that the code units 102K, 102L, and 102M to which the shadow unit 110H corresponds does.

The code units 114E and 114F encoding a version of the character 106B appear after the code units 114A, 114B, and 114C in the processed string 112 that encode a version of the character 106A, just as the code units 102C, 102D and 102E encoding the character 106B appear after the code unit 102A in the original string 100 that encode the character 106A. The code unit 114H encoding a version of the character 106C appears after the code units 114E and 114F in the processed string 112, just as the code units 102G and 102H that encode the character 106C appear after the code units 102C, 102E, and 102E in the original string 100. The code units 114K and 114L encoding a version of the character 106D appears after the code unit 114H in the processed string 112, just as the code units 102K, 102L, and 102M appear after the code units 102G and 102H in the original string 100.

In the depicted example, the processed string 112 is UTF-8 encoded. Therefore, that the code unit 114A is indicated as "3" means that it has the most significant bits 1110. That the code units 114B, 114C, 114F, and 114L are each indicated as "C" means that each has the most significant bits 10. That the code units 114E and 114K are each indicated as "2" means that each has the most significant bits 110. That the code unit 114H is indicated as "1" means that it has the most significant bit 0.

The processed string 112 in the example implementation also has invalid code units 114 corresponding to (and having the same value as) the invalid code units 102 of the original string 100, in the same logical order as the invalid code units 102 within the string 100, and which are indicated with shading. The invalid code units 102 of the original string 100 can thus be recovered from these code units 114 of the processed string 112. The invalid code unit 114D corresponds to the shadow unit 102B corresponding to the invalid code unit 102B, and therefore has the same value as the code unit 102B. The invalid code units 114G, 114I, and 114J respectively correspond to the shadow units 110D, 110E, and 110F corresponding to the invalid code units 102F, 102I, and 102J, and therefore have the same values as the code units 102F, 102I, and 102J.

The invalid code unit 114D appears in the processed string 112 between the code units 114A, 114B, and 114C encoding a version of the character 106A and the code units 114E and 114F that encode a version of the character 106B. Therefore, the invalid code unit 114D has logical positional correspondence with the invalid code unit 102B, which similarly appears in the original string 100 between the code unit 102A encoding the character 106A and the code units 102C, 102D, and 102E encoding the character 106B.

The invalid code unit 114G appears in the processed string 112 between the code units 114E and 114F encoding a version of the character 106B and the code unit 114H that encodes a version of the character 106C. Therefore, the invalid code unit 114G has logical positional correspondence with the invalid code unit 102F, which similarly appears in the original string 100 between the code units 102C, 102D, and 102E encoding the character 106B and the code units 102G and 102H encoding the character 106C.

The invalid code units 114I and 114J appear in the processed string 112 between the code unit 114H encoding a version of the character 106C and the code units 114K and 114L encoding a version of the character 106D. Therefore, the invalid code units 114I and 114J have logical positional correspondence with the invalid code units 102I and 102J, which similarly appear in the original string 100 between the code units 102G and 102H encoding the character 106C and the code units 102K, 102L, and 102M encoding the character 106D.

Figure 2A:
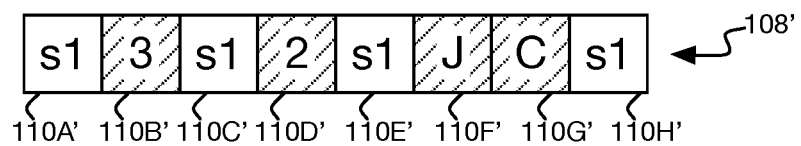
FIGS. 2A and 2B are diagrams of another example shadow array and another example processed string, respectively, corresponding to the original string of FIG. 1.

FIG. 2A shows another example shadow array 108', which can be generated from the original string 100 instead of the shadow array 108. The shadow array 108' has shadow units 110A', 110B, 110C', 110D', 110E', 110F', 110G', and 110H', which are collectively referred to as the shadow units 110'. Like the shadow units 110 of the shadow array 108, each shadow unit 110' corresponds to a tuple of one, two, three, or four code units 102 of the original string 100 that validly encode one of the characters 106, or to an invalid code unit 102. The shadow units 110A', 110C', 110E', and 110H' that correspond to valid tuples of one, two, three, or four code units 102 are indicated without shading. The shadow units 110B', 110D', 110F', and 110G' that each correspond to an invalid code unit 102 are indicated with shading.

As with the shadow units 110 corresponding to valid tuples of code units 102, the shadow units 110' corresponding to valid tuples of code units 102 are each a first prespecified shadow unit having a value of "s1." By comparison, unlike with the shadow units 110 corresponding to invalid code units 102, shadow units 110' corresponding to invalid code units 102 are (i.e., have the same values as) or encode the invalid code units 102 themselves. This means that the invalid code units 102 can be recovered from the shadow array 108'.

Therefore, the shadow units 110B', 110D', 110G', and 110G' corresponding to the invalid code units 102B, 102F, 102I, and 102J are denoted as "3", "2", "J", and "C", respectively, in correspondence with how the code units 102B, 102F, 102I, and 102J are denoted. The invalid code units 102 can thus be recovered from the values of the shadow units 110'. The shadow units 110' may each be equal in size, and may each be equal or larger in size as compared to the size of each code unit 102 of the string 100.

The shadow array 108', like the shadow array 108, preserves the logical positional information of the original string as to the characters 106 encoded within the string 100 in relation to the invalid code units 102B, 102F, 102I, and 102J of the string 100. Like the shadow array 108, the shadow array 108' therefore has logical positional correspondence with the original string 100. The logical position of each shadow unit 110' within the shadow array 108'

(relative to the other shadow units 110') corresponds to the logical position of a corresponding character 106 as validly encoded within the string 100 or of a corresponding invalid code unit 102 within the string 100 (relative to the other characters 106 validly encoded within the string 100 and the other invalid code units 102 of the string 100).

However, also like the shadow array 108, the shadow array 108' does not have physical position correspondence with the original string 100. That is, the physical position of each shadow unit 110' within the shadow array 108' (relative to the other shadow units 110') does not correspond to the physical position of a corresponding character 106 as validly encoded within the string 100 or of a corresponding invalid code unit 102 within the string 100 (relative to the other characters 106 validly encoded within the string 100 and the other invalid code units 102 of the string 100).

Figure 2B:
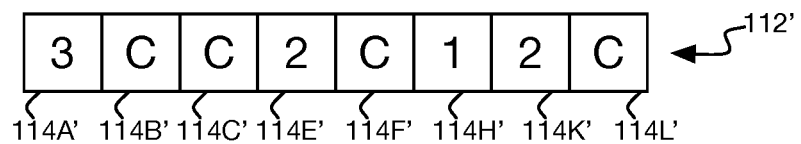

FIG. 2B shows another example processed string 112', which can be generated from the original string 100 instead of the processed string 112. The processed string 112' can be identical to the processed string 112, but without any code units corresponding to the invalid code units 102 of the original string 100. The processed string 112' has code units 114A', 114B', 114C', 114E', 114F', 114H', 114K', and 114L', which can be identical to the characters code units 114A, 114B, 114C, 114E, 114F, 114H, 114K, and 114L of the processed string 112, respectively. The string 112' thus does not have any code units identical or that otherwise correspond to the code units 114D, 114G, 114I, and 114J of the string 112.

The processed string 112' therefore just has code units 114' corresponding to tuples of valid code units 102 within the original string 100, and does not have any code units corresponding to invalid code units 102 of the string 100. This means that the invalid code units 102 cannot be recovered from the processed string 112' (but may instead be recovered from the shadow array 108'). Further, whereas the processed string 112 has logical positional correspondence with the original string 100 both as to the valid and invalid code units 102 of the string 100, the processed string 112' has logical positional correspondence with the string 100 just as to the valid code units 102, since the string 112' lacks code units corresponding to the invalid code units 102.

FIG. 3 shows an example method 300 for generating the shadow array 108/108' and the processed string 112/112' (that is, either the shadow array 108 or 108' and either the processed string 112 or 112') from the original string 100. A pointer is set to the first code unit 102A of the original string 100 (301). Then, whether the code unit 102 referenced by the pointer is valid or not is determined (302). Whether the referenced code unit 102 is valid or not is determined differently depending on the encoding scheme in which the string 100 encodes the characters 106 via the code units 102.

For example, in the case of UTF-8 encoding, if the referenced code unit 102 has the most significant bit 0, the code unit 102 is valid. Otherwise, if the referenced code unit 102 has the most significant bits 110, and the following code unit 102 has the most significant bits 10, then the referenced code unit 102 as well as the following code unit 102 are valid. Otherwise, if the referenced code unit 102 has the most significant bits 1110, and the following two code units 102 each have the most significant bits 10, then the referenced code unit 102 and the following two code units 102 are valid. Otherwise, if the referenced code unit 102 has the most significant bits 11110, and the following three code units 102 each have the most significant bits 10, then the referenced code unit 102 and the following three code units 102 are valid.

Otherwise, the code unit 102 referenced by the pointer is invalid. The referenced code unit 102 may have the most significant bits 11111, which is not permitted in UTF-8 encoding. The referenced code unit 102 may instead have the most significant bits 10, which is permitted in UTF-8 encoding, but by virtue of the logic of the method 300, the code unit 102 is not preceded by one or multiple other code units that together constitute a valid two, three, or four code unit tuple character encoding. The referenced code unit 102 may instead have the most significant bits 110, 1110, or 11110, but not have one or more following code units 102 per the previous paragraph.

As another example, in the case of UTF-16 encoding, a character 106 is encoded by two code units 102, except for a supplementary character 106 that does not fit within a two-code unit address space. A character 106 that is encoded by two code units 102 will always begin with an initial code unit 102 that is referred to as a low surrogate and that is in the range of D800 and DBFF, and will always be followed by a code unit 102 that is referred to as a high surrogate and that is in the range of DC00 through DFFF.

Therefore, if the referenced code unit 102 is a not a high surrogate in the range of hexadecimal D800 through DBFF and is not a low surrogate in the range of hexadecimal DC00 through DFFF, then the referenced code unit 102 is valid. Otherwise, if the referenced code unit 102 is a high surrogate in the range of hexadecimal D800 through DBFF, and is followed by a code unit 102 that is a low surrogate in the range of hexadecimal DC00 through DFFF, then the referenced code unit 102 and the following code unit 102 are both valid.

Otherwise, the code unit 102 referenced by the pointer is invalid. The referenced code unit 102 may be a high surrogate in the range of hexadecimal D800 through DBFF, but not be followed by a code unit 102 that is a low surrogate in the range of hexadecimal DC00 through DFFF. The referenced code unit 102 may instead be a low surrogate in the range of hexadecimal DC00 through DFFF, but by virtue of the logic of the method 300, the code unit 102 is not preceded by a high surrogate in the range of hexadecimal D800 through DBFF.

If the code unit 102 referenced by the pointer is valid (302), then the code unit 102 by itself or in conjunction with one or more following code units 102 encodes a single character 106. Therefore, starting at the referenced code unit 102, the code units 102 within the original string 100 that encode such a single character 106 are processed (304). An example of such processing is described later in the detailed description.

In one implementation, the results of the processing can be an encoding of a version of the single character 106 encoded within the original string 100, in the same or different encoding scheme than that of the string 100. For example, the processing results may be the same character 106 encoded within one or multiple code units 102 starting at the referenced code unit 102, but encoded in a different encoding scheme. As another example, the processing results may be the character 106 encoded within the original string 100 as converted to a different character, where this different character is encoded in the same or different encoding scheme.

The processing results (i.e., the one or more code units 102 starting at the referenced code unit 102 as have been processed) are appended to the processed string 112/112' (306). The processed string 112/112' initially has no code units 114/114', and therefore the first time processing results are appended, these processing results constitute the first code unit 114/114' or code units 114/114' of the string 112/112'. A shadow unit 110/110' is appended to the shadow array 108/108' indicating that the processed code units or code units 102 within the original string 100 validly encode a character 106 (308). For example, a shadow unit 110/110' having the value "s1" may be appended. As with the processed string 112/112', the shadow array 108/108' initially has no shadow units 110/110', and therefore the first time a shadow unit 110/110' is appended, the shadow unit 110/110' is the first shadow unit 110/110' of the array 108/108'.

If all the code units 102 of the original string 100 have not yet been processed (310), then the pointer is advanced to the code unit 102 following the code units 102 of the string 100 that have been processed (312). The method 300 is then repeated at 302. For example, if the code unit 102 referenced by the pointer is a single code unit tuple encoding a character 106, then the pointer is advanced to the next code unit 102 within the original string 100.

If the referenced code unit 102 along with the following code unit 102 constitute a two code unit tuple encoding a character 106, then the pointer is advanced to the code unit 102 after the code unit 102 following the referenced code unit 102. If the referenced code unit 102 along with the following two code units 102 constitute a three code unit tuple encoding a character 106, then the pointer is advanced to the code unit 102 after the second code unit 102 following the referenced code unit 102. If the referenced code unit 102 along with the following three code units 102 constitute a four code unit tuple encoding a character 106, then the pointer is advanced to the next code unit 102 after the third code unit 102 following the referenced code unit 102.

By comparison, in response to determining that the code unit 102 referenced by the pointer is determined as being invalid (302), one of the following is performed (314). First, the referenced code unit 102 may be appended as a shadow unit 110' to the shadow array 108' without processing, and no code units 114' may be appended to the processed string 112' (316). The referenced code unit 102 is added as a shadow unit 110' to the shadow array 108' without processing in that the code unit 102 is copied to the shadow array 108' as the shadow unit 110'. The referenced code unit 102 in this case can be later recovered from just the shadow array 108', since no corresponding code units 114' are added to the processed string 112'.

Second, a shadow unit 110 may instead be appended to the shadow array 108 indicating that the referenced code unit 102 is invalid, and the referenced code unit 102 may be added as a code unit 114 to the processed string 112 without processing (318). For example, a shadow unit 110 having the value "s2" may be appended. The referenced code unit 102 is added as a code unit 114 to the processed string 112 in that the code unit 102 is copied to the processed string 112 as the code unit 114. In this case, the referenced code unit 102 can later be recovered from just the processed string 112. In another implementation, the referenced code unit 102 may be added as both a code unit 114 to the processed string 112 and as a shadow unit 110' to the shadow array 108' without processing, in which case the code unit 102 can later be recovered from either the processed string 112 or the shadow array 108'.

If all the code units 102 of the original string 100 have not yet been processed (320), then the pointer is advanced to the next code unit 102 within the original string 100 (322). The method 300 is then repeated at 302. Once all the code units 102 of the original string 100 have been processed (310, 320), the method 300 is either finished or more processing occurs (324), as described later in the detailed description. A shadow array 108/108' and a processed string 112/112' corresponding to the original string 100 are thus ultimately generated.

Figure 4A:
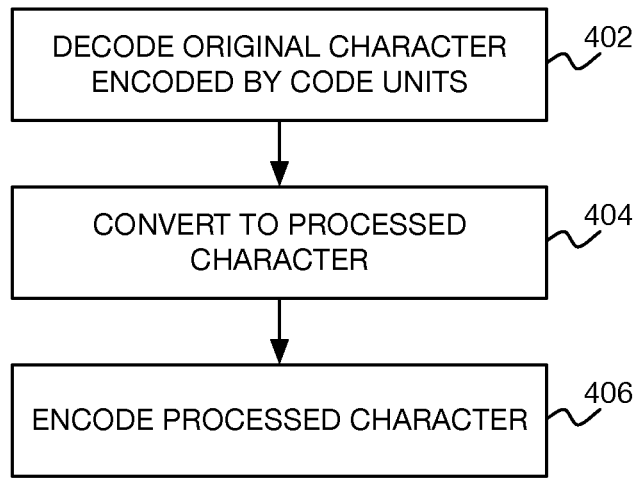
FIG. 4A is a flowchart of an example method for processing a character of an original string.

FIG. 4A shows an example method 400 for processing one or more code units 102 of the original string 100 that validly encode a single original character 106, to generate one or more corresponding code units 114/114' of the processed string 108/108. The method 400 can be performed to implement 304 of the method 300, and in this case no further processing occurs in 324 of the method 300. The original character 106 may be decoded from the tuple of one, two, three, or four code units 102 that encode the character 106, starting at the code unit 102 referenced by the pointer (402). The original character 106 is decoded according to the encoding scheme of the original string 100.

The original character 106 may then be converted to a processed character (404). For example, in one case, the original character 106 may undergo encryption, resulting in a processed character that is an encrypted version of the original character 106. In another implementation, however, the original character 106 may not undergo any conversion, such that the processed character is identical to the original character.

The processed character is then encoded as a tuple of one, two, three, or four code units 114/114' for addition to the processed string 112/112' (406). The encoding scheme of the processed string 112/112' may be the same as or different than the encoding scheme of the original string 100. Furthermore, even if the encoding of the processed string 112/112' is identical to the encoding scheme of the original string 100, the number of code units 114/114' encoding the processed character may be different than the number of code unit 102 encoding the original character 106. The code units 114/114' constitute the code units 102 as processed that are appended to the processed string 112/112' in 306 of the method 300.

Figure 4B:
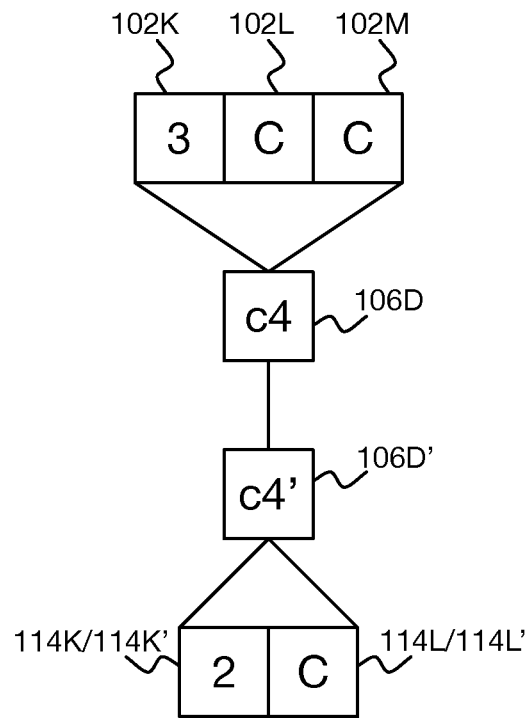
FIG. 4B is a diagram depicting example performance of the method.

FIG. 4B shows example performance of the method 400, in relation to the code units 102K, 102L, and 102M of the original string 100 that encode the original character 106D. The original character 106D is decoded from the code units 102K, 102L, and 102M. The original character 106D may then be converted to a processed character 106D', which is depicted as "c4'" in the example.

The processed character 106D' is then encoded as the code units 114K/114K' and 114L/114L'. That is, the code units 114K/114K' and 114L/114L' are the processing results of the method 400, and thus constitute the code units 102K, 102L, and 102M as processed per the method 400. The code units 114K/114K' and 114L/114L' can then be appended to the processed string 112/112'.

Figure 5A:
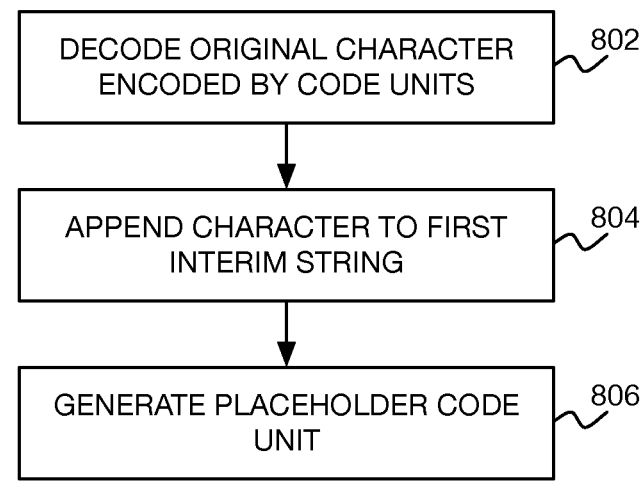
FIG. 5A is a flowchart of another example method for processing a character of an original string.

FIG. 5A shows another example method 800 for processing one or more code units 102 of the original string 100 that validly encode a single original character 106. The method 800 can also be performed to implement 304 of the method 300, and in this case further processing occurs in 324 of the method 300 as described later in the detailed description. The original character 106 can be decoded from the tuple of one, two, three, or four code units 102 that encode the character 106, starting at the code unit 102 referenced by the pointer (802). The original character 106 is decoded according to the encoding scheme of the original string 100.

The original character 106 is then appended to a first interim string (804). Therefore, once the original string 100 has been completely processed, the first interim string that has been constructed or generated includes all the characters 106 encoded within the original string 100. A placeholder code unit is also generated (806), and constitutes the code units 102 as processed that are appended to the processed string 112/112' in 306 of the method 300.

The placeholder code unit may be the same regardless of what the original character 106 is that has been decoded in 802. The placeholder code unit may be a valid code unit in the encoding scheme of the processed string 112/112' and/or the encoding scheme of the original string 100. The placeholder code unit is appended as a placeholder to the processed string 112/112' in 306 of the method 300, for subsequent replacement once all the code units 102 of the original string 100 have been processed in the method 300.

Figure 5B:
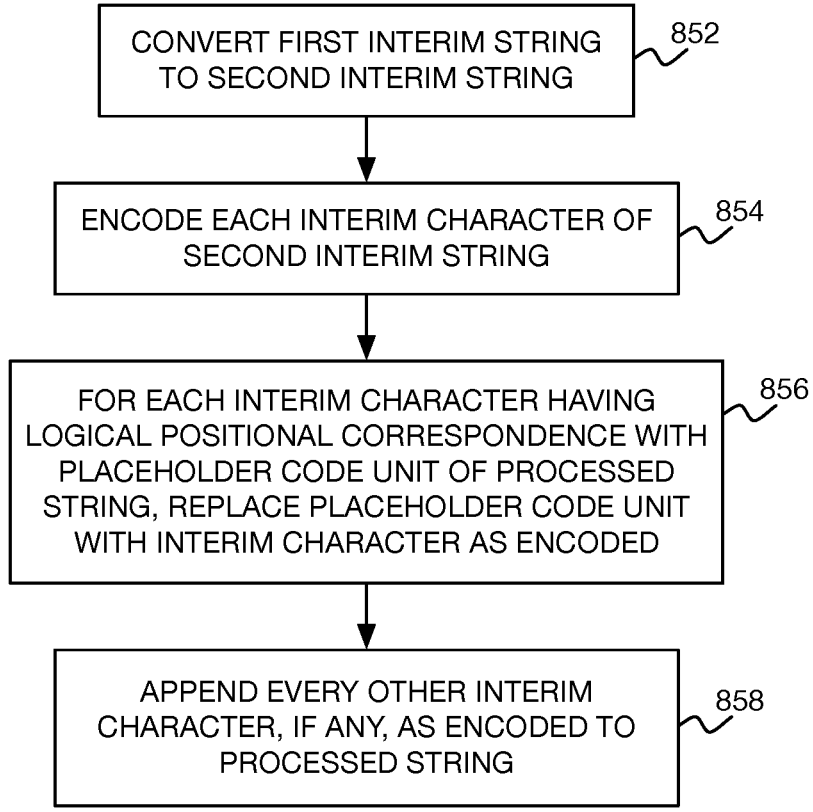
FIG. 5B is a flowchart of an example method that is performed as part of the method of FIG. 3 when the example method of FIG. 5A is performed to process each character of the original string.

FIG. 5B shows an example method 850 that can be performed in conjunction with (i.e., as part of) the method 300 in an implementation in which the method 800 is performed to implement 304. The method 850 is specifically performed to implement 324 of the method 300, after all the code units 102 of the original string 100 have been processed. The first interim string, which is made up of the original characters 106 of the original string 100, is converted to a second interim string (852). For instance, the first interim string may undergo encryption to generate the second interim string.

The second interim string has a number of characters, which are referred to as interim characters herein, that is equal or greater in number to the original characters 106 of the first interim string. Whereas in the method 400 each original character 106 is converted without consideration of the other characters 106 (i.e., each character 106 is individually converted), in the method 850 the first interim string as a whole is converted to generate the second interim string. That is, each individual character 106 of the first interim string is not separately converted to a corresponding interim character of the second interim string. This is why there may be more interim characters than original characters 106.

Each interim character of the second interim string is then encoded as one or more code units, which are referred to as interim code units, within the encoding scheme of the processed string 112/112' (854). The encoding scheme of the processed string 112/112' may be the same as or different than the encoding scheme of the original string 100. Once the interim characters have each been encoded as one or more interim code units, the placeholder code units can be replaced within the processed string 112/112'.

Specifically, for each interim character having logical positional correspondence with a respective placeholder code unit of the processed string 112/112', the placeholder code unit in question is replaced with the one or more interim code units encoding that interim character (856). For example, the first interim character has logical positional correspondence with the first placeholder code unit, the second interim character has second logical positional correspondence with the second placeholder code unit, and so on. In the case in which there are more interim characters than original characters 106, however, there will be interim characters that do not have logical positional correspondence with a placeholder code unit.

The one or more code units that encode every other such interim character are appended to the processed string 112/112' (858). That is, for each interim character that does not have logical positional correspondence with a respective placeholder code unit, the one or more interim code units encoding the interim character in question are appended to the processed string 112/112'. For example, if there are four interim characters and three original characters 106, then the fourth interim character does not have logical positional correspondence with any placeholder code unit, and the one or more code units encoding this interim character are appended to the processed string 112/112'.

Figure 6A:
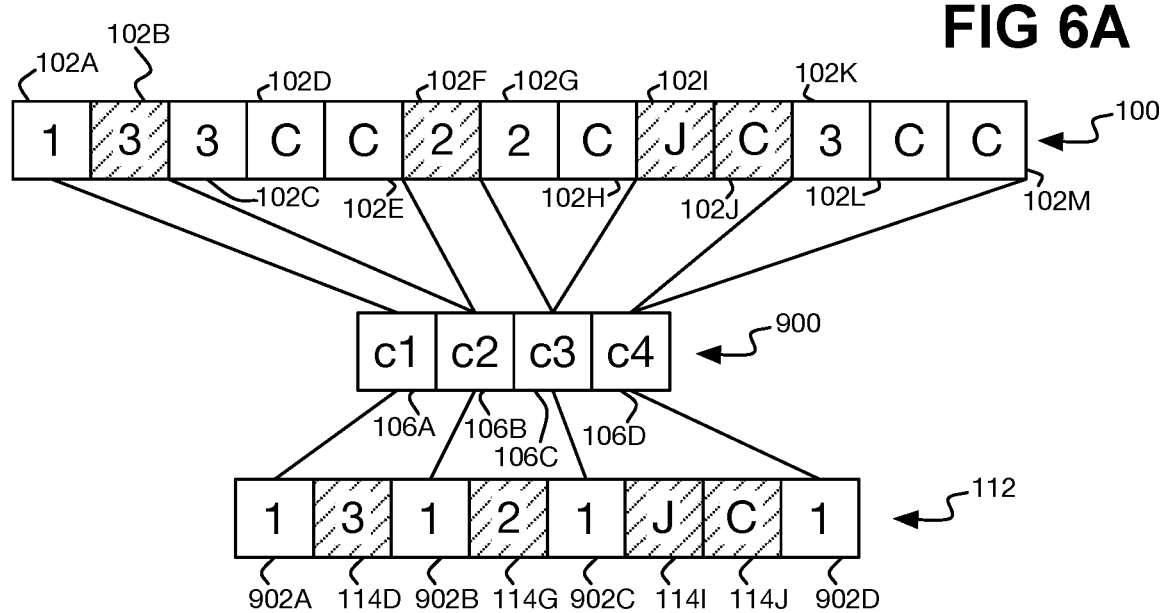
FIGS. 6A and 6B are diagrams depicting example performance of the methods of FIGS. 5A and 5B when performed in conjunction with the method of FIG. 3.
Figure 6B:
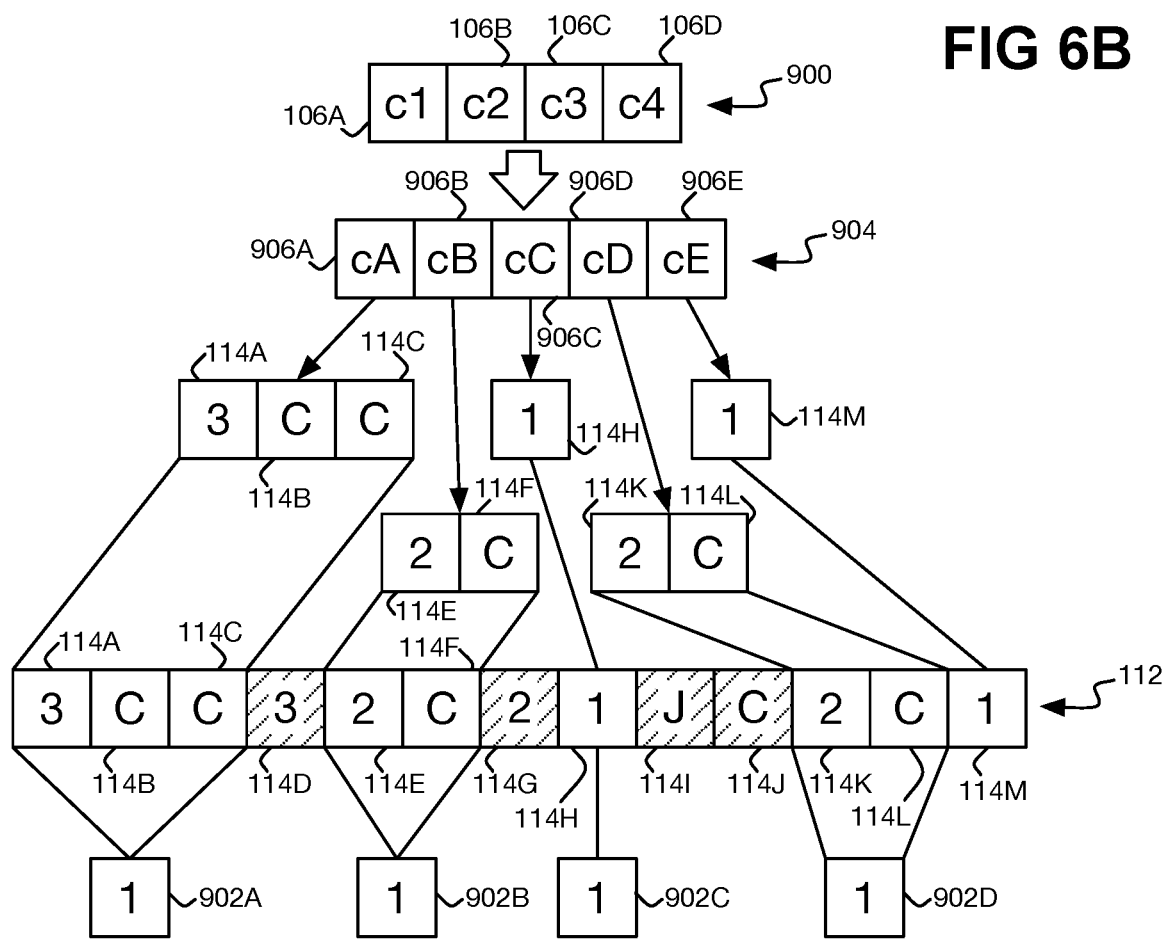

FIGS. 6A and 6B show example performance of the methods 800 and 850 in conjunction with the method 300. In FIG. 6A, per the method 800, the original characters 106 are decoded from the valid code units 102 of the original string 100 to generate a first interim string 900. For instance, when the method 800 is performed the first time in relation to the code unit 102A, the character 106A is decoded and appended to the first interim string 900.

When the method 800 is performed the next time in relation to the code units 102C, 102D, and 102E, the character 106B is decoded and appended to the first interim string 900. When the method 800 is performed the third time in relation to the code units 102G and 102H, the character 106C is decoded and appended to the first interim string 900. When the method 800 is performed the fourth time in relation to the code units 102K, 102L, and 102M, the character 106D is decoded and appended to the first interim string 900.

Also per the method 800, placeholder code units 902A, 902B, 902C, and 902D, collectively referred to as the placeholder code units 902, are generated for the characters 106 of the first interim string 900 and appended to the processed string 112 when 306 of the method 300 is performed. The placeholder code units 902 are each depicted as "1" in the example to indicate that each code unit 902 begins with the most significant bit 0, and therefore by itself validly encodes a character in the UTF-8 encoding scheme. The first time the method 800 is performed, the placeholder code unit 902A corresponding to the character 106A is generated and is then appended to the processed string 112 when 306 of the method 300 is subsequently performed.

The second time the method 800 is performed, the placeholder code unit 902B corresponding to the character 106B is generated and is then appended to the processed string 112 when 306 of the method 300 is subsequently performed. The third time the method 800 is performed, the placeholder code unit 902C corresponding to the character 106C is generated and is then appended to the processed string 112 when 306 of the method 300 is subsequently performed. The fourth time the method 800 is performed, the placeholder code unit 902D corresponding to the character 106D is generated and is then appended to the processed string 112 when 306 of the method 300 is subsequently performed.

In FIG. 6B, per the method 850, the first interim string 900 is converted to a second interim string 904. The second interim string 904 has five characters 906A, 906B, 906C, 906D, and 906E, which are collectively referred to as the characters 906. The characters 906 are depicted as "cA", "cB", "cC", "cD", and "cE" to differentiate them from the characters 106 of the first interim string 900. There are more characters 906 in the second interim string 904 than in the first interim string 900.

Next, per the method 850, the characters 906 are each encoded as one or more code units 114 in the encoding scheme of the processed string 112 (such as UTF-8 in the example), which ultimately become part of the processed string 112. The code units 114A, 114B, and 114C encode the character 906A; the code units 114E and 114F encode the character 906C; the code unit 114H encodes the character 906C; the code units 114K and 114L encode the character 906D; and the code unit 114M encodes the character 906E. The code units 114A, 114B, and 114C; the code units 114E and 114F; the code unit 114H; and the code units 114K and 114L are depicted in the example as described above in relation to FIG. 1. The code unit 114M is depicted in "1" in the example, which means that the code unit 114M has the most significant bit 1.

Also per the method 850, the placeholder code units 902 are respectively replaced in the processed string 112 with the code units 114 encoding the interim characters 906 having positional correspondence to the placeholder code units 902. The interim character 906A has positional correspondence to the placeholder code unit 902A, and therefore is replaced in the processed string 112 by the code units 114A, 114B, and 114C encoding the character 906A. The interim character 906B has positional correspondence to the placeholder code unit 902B, and therefore is replaced in the processed string 112 by the code units 114E and 114F encoding the character 906B.

The interim character 906C has positional correspondence to the placeholder code unit 902C, and therefore is replaced in the processed string 112 by the code unit 114H encoding the character 906C. The interim character 906D has positional correspondence to the placeholder code unit 902D, and therefore is replaced in the processed string 112 by the code units 114K and 114L encoding the character 906D. Finally per the method 850, the code unit 114M encoding the interim character 906E that does not have positional correspondence to any placeholder code unit 902 is appended at the end of the processed string 112.

In an implementation in which the processed string 112 (as opposed to the processed string 112') is generated, and the encoding scheme of the processed string 112 is the same as that of the original string 100, the original string 100 can be reconstructed, or recovered, from the processed string 112 in the same manner used to generate the processed string 112. For example, the method 300 may be used. In this case, the processed string 112 is input into the method 300, and the output of the method 300 is the original string 100. In such an implementation, the shadow array 108/108' that is generated along with the processed string 112 from the original string 100 is not needed to recover or reconstruct the original string 100 from the processed string 112.

In other implementations, the processed string 112' may be generated from the original string 100, and/or the processed string 112/112' may have an encoding scheme different than that of the original string 100. In such cases, the process used to generate the processed string 112/112' from the original string 100 (e.g., the method 300) may not be able to recover the original string 100 from the processed string 112/112'. Rather, a different process may have to be performed, in which both the processed string 112/112' and the shadow array 108/108' are used to recover or reconstruct the original string 100.

FIG. 7 shows such an example method 500 for reconstructing the original string 100 from the shadow array 108/108' and the processed string 112/112' (that is, from either the shadow array 108 or 108' and either the processed string 112 or 112'). A shadow pointer is set to the first shadow unit 110A/110A' of the shadow array 108/108' (501). A code pointer is similarly set to the first code unit 114A/114A' of the processed string 112/112' (502).

Whether the shadow unit 110/110' referenced by the shadow pointer indicates a corresponding invalid code unit 102 of the original string 100 or one or more corresponding valid code units 102 encoding a character 106 of the string 100 is determined (504). In the case of the shadow array 108, the referenced shadow unit 110 indicates a corresponding invalid code unit 102 if the shadow unit 110 has a value of "s2", and indicates one or more corresponding valid code units 102 if the shadow unit 110 has a value of "s1". In the case of the shadow array 108', the referenced shadow unit 110' indicates one or more corresponding valid code units 102 if the shadow unit 110' has a value of "s1", and otherwise indicates a corresponding invalid code unit 102.

If the shadow unit 110/110' referenced by the shadow pointer corresponds to one or more corresponding valid code units 102 of the original string 100 that encode a character 106 (504), then the code unit 114/114' referenced by the code pointer by itself or in conjunction with one or more following code units 114/114' encode a corresponding processed character. Therefore, starting at the referenced code unit 114/114', the code units 114/114' within the processed string 112/112' that encode such a single processed character are processed (506). An example of such processing is described later in the detailed description.

In general, the results of the processing can be the corresponding code unit 102 or code units 102 of the original string that encode the single original character 106 corresponding to the processed character encoded by the code units 114/114'. As noted, the processed character encoded by the code units 114/114' may be a converted version of the original character 106, such as an encrypted version of the character 106, or may be original character 106 itself. As also noted, the code units 114/114' may encode the processed character using the same or different encoding scheme than the encoding scheme by which the code units 102 encode the original character 106. In another implementation, the processing results may just be the original character 106 itself, and not the one or more code units 102 that encode the character 106.

The processing results (e.g., the recovered one or more code units 102 encoding the corresponding original character 106) are appended to the original string 100 undergoing reconstruction (508). The original string 100 when first being reconstructed has no code units 102. Therefore, the first time processing results are appended, these processing results are the first code unit 102 or code units 102 of the string 100.

If all the shadow units 110/110' of the shadow array 108/108' have not yet been processed (510), then the shadow pointer is advanced to the next shadow unit 110/110' of the array 108/108' (512). The code pointer is also advanced to the code unit 114/114' of the processed string 112/112' following the code units 114/114' that have been processed (514), and the method 500 is repeated at 504. For example, if the code unit 114/114' referenced by the code pointer is a single code unit tuple encoding a processed character, then the code pointer is advanced to the next code unit 114/114' within the processed string 112/112'.

If the referenced code unit 114/114' along with the following code unit 114/114' constitute a two code unit tuple encoding a processed character, then the code pointer is advanced to the code unit 114/114' after the code unit 114/114' following the referenced code unit 114/114'. If the referenced code unit 114/114' along with the following two code units 114/114' constitute a three code unit tuple encoding a processed character, then the code pointer is advanced to the code unit 114/114' after the second code unit 114/114' following the referenced code unit 114/114'. If the referenced code unit 114/114' along with the following three code units 114/114' constitute a four code unit tuple encoding a processed character, then the code pointer is advanced to the next code unit 114/114' after the third code unit 114/114' following the referenced code unit 114/114'.

By comparison, in response to determining that the shadow unit 110/110' referenced by the shadow pointer corresponds to an invalid code unit 102 of the original string

100 (504), processing of one of the two following cases is performed (516). The first case corresponds to when the processed string 112' and not the processed string 112 was previously generated, and when the shadow array 108' and not the shadow array 108 was previously generated. The referenced shadow unit 110' is appended as an invalid code unit 102 to the original string 100 without processing (518). The referenced shadow unit 110' is added as an invalid code unit 102 to the original string 100 without processing in that the shadow unit 110' is copied to the string 100 as the invalid code unit 102. The invalid code unit 102 is thus recovered from the shadow array 108'.

If all the shadow units 110' of the shadow array 108' have not yet been processed (520), then the shadow pointer is advanced to the next shadow unit 110' of the array 108' (522). The method 500 is then repeated at 504. Note in this case the code pointer is not advanced, because the processed string 112' does not include any code units 114' corresponding to invalid code units 102 of the original string 100.

The second case corresponds to when the processed string 112 and not the processed string 112' was previously generated, regardless of whether the shadow array 108 or 108' was previously generated. The code unit 114 referenced by the code pointer can be appended as an invalid code unit 102 to the original string 100 without processing (524). The referenced code unit 114 is added as an invalid code unit 102 to the original string 100 without processing in that the code unit 114 is copied to the string 100 as the invalid code unit 102. However, if the shadow array 108' and not the shadow array 108 was previously generated, the shadow unit 110' referenced by the shadow pointer can instead be appended as the invalid code unit 102 to the original string 100 without processing. The invalid code unit 102 is thus recovered.

If all the shadow units 110/110' of the shadow array 108/108' have not yet been processed (526), then the shadow pointer is advanced to the next shadow unit 110/110' of the array 108/108' (528). Because in this case the processed string 112 includes code units 114 corresponding to invalid code units 102 of the original string 100, the code pointer is also advanced to the next code unit 114 within the processed string 112 (530), and the method 500 is repeated at 504. Once all the shadow units 110/110' of the shadow array 108/108' have been processed (510, 520, 526), the method 500 is finished (532), such that the original string 100 has been reconstructed.

Figure 8A:
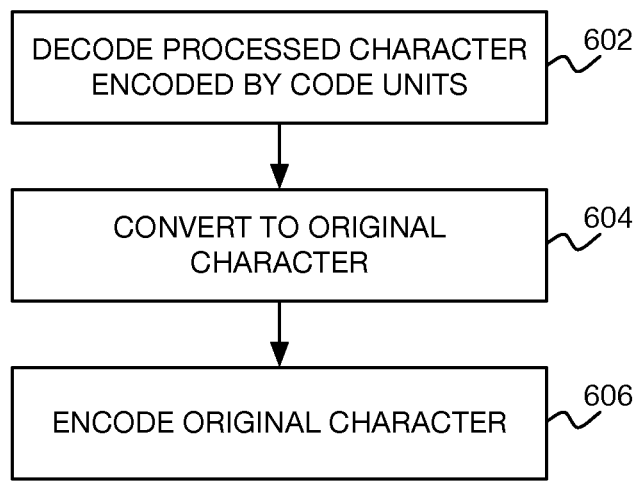
FIG. 8A is a flowchart of an example method for processing a character of a processed string in which the character is encoded to reconstruct a corresponding encoded character of an original string.

FIG. 8A shows an example method 600 for processing one or more code units 114/114' of the processed string 112/112' that validly encode a processed character, to recover one or more corresponding code units 102 of the original string 100. The method 600 can be performed to implement 506 of the method 500. The processed character may be coded from the tuple of one, two, three, or four code units 114/114' that encode the character, starting at the code unit 114/114' referenced by the code pointer (602). The processed character is decoded according to the encoding scheme of the processed string 112/112.

The processed character may then be converted to a corresponding original character 106 (604). For example, if the original character 106 previously had undergone encryption to generate the processed character, the processed character may now undergo corresponding decryption to recover the original character 106. In another implementation, the original character 106 may not have undergone any conversion, such that the original character 106 is recovered as the processed character.

The recovered character is then encoded as a tuple of one, two, three, or four code units 102 for addition to the original string 100 being reconstructed (606). The encoding scheme of the original string 100 may be the same as or different than the encoding scheme of the processed string 112/112'. Furthermore, even if the encoding scheme of the original string 100 is identical to the encoding scheme of the processed string 112/112', the number of code units 102 encoding the original character 106 may be different than the number of code units 114/114' encoding the processed character.

Figure 8B:
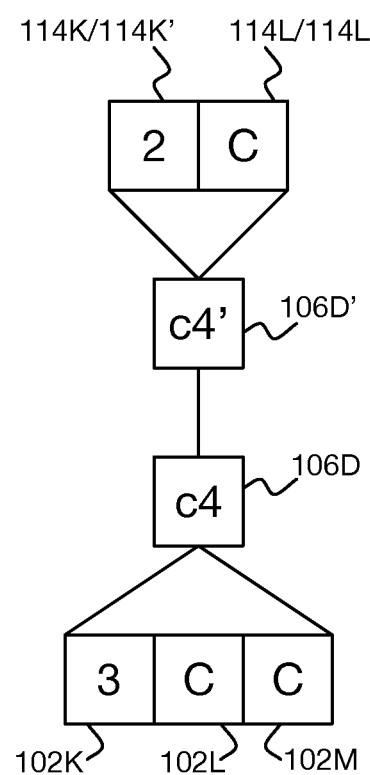
FIG. 8B is a diagram depicting example perform of the method.

FIG. 8B shows example performance of the method 600, in relation to the code units 114K/114K' and 114L/114L' of the processed string 112/112'. The processed character 106D' is decoded from the code units 114K/114K' and 114L/114L'. The processed character 106 may then be converted to the original character 106D. The original character 106D is encoded as the code units 102K, 102L, and 102M, which are the processing results of the method 600, and thus are the code units 114K/114K' and 114L/114L' as processed. The code units 102K, 102L, and 102M can then be appended to the original string 100.

FIG. 9 shows an example system 700. The system can include computing devices 702 and 704 that are communicatively connected over a network 706. Each of the computing devices 702 and 704 may be a laptop, notebook, or desktop computer, or another type of computing device, such as a server, smartphone, tablet computing device, and so on. The network 706 may be or include the Internet and/or other types of networks, including local-area networks (LANs), wide-area networks (WANs), wired networks, wireless networks, mobile communication networks, and so on.

The computing device 702 includes a processor 708, a memory 710 storing program code 712, and a storage device 714. The computing device 704 similarly includes a processor 716, a memory 718 storing program code 720, and a storage device 722. The memories 710 and 718 are examples of non-transitory computer-readable data storage media. The processors 708 and 716 respectively execute the program code 712 and 720 to perform processing. The storage devices 714 and 722 may be hard disk drives, solid state drives, or other types of storage devices.

The storage device 714 stores the original string 100. The processor 708 executes the program code 712 to generate the shadow array 108/108' and the processed string 112/112' from the original string 100, and may store the shadow array 108/108' and the processed string 112/112' on the storage device 714. The processor 708 may generate the shadow array 108/108' and the processed string 112/112' by performing the method 300, for instance. The computing device 702 may then transmit just the processed string 112/112' or both the processed string 112/112' and the shadow array 108/108' over the network 706 to the computing device 704.

The storage device 714 stores the shadow array 108/108' and/or the processed string 112/112' as received from the computing device 702. The processor 716 executes the program code 720 to reconstruct the original string 100 from just the processed string 112/112' or from both the shadow array 108/108' and the processed string 112/112'. The processor 716 may recover the original string 100 by performing the method 300 or 500, for instance. Therefore, the computing device 704 is able to recover the original string 100 even though the computing device 702 did not transmit the string 100.

Techniques have been described for processing an original string in such a way that logical positional information is retained even when the original string includes invalid code units. Any invalid code units within the original string are also retained. Therefore, no information—either positional information or invalid code units—is lost when the original string is processed.

We claim:

1. A non-transitory computer-readable data storage medium storing program code executable by a processor to perform processing comprising:
   setting a pointer to a first code unit of an original string encoding characters via a plurality of code units, including the first code unit, within an encoding scheme;
   determining whether the code unit of the original string referenced by the pointer is valid within the encoding scheme;
   in response to determining that the code unit of the original string referenced by the pointer is valid:
      starting at the code unit referenced by the pointer, processing one or more code units of the original string that encode a single character within the encoding scheme;
      appending the one or more code units as have been processed to a processed string;
      appending, to a shadow array corresponding to the original string, a single shadow unit indicating that the one or more code units that have been processed are valid; and
      advancing the pointer to the code unit of the original string following the one or more code units.

2. The non-transitory computer-readable data storage medium of claim 1, wherein the processing further comprises, in response to determining that the code unit of the string referenced by the pointer is invalid:
   appending, to the shadow array, a single shadow unit indicating that the code unit is invalid;
   advancing the pointer to a next code unit of the original string.

3. The non-transitory computer-readable data storage medium of claim 2, wherein the processing further comprises, in response to determining that the code unit of the string referenced by the pointer is invalid:
   appending the code unit of the string referenced by the code unit to the processed string without first processing the code unit.

4. The non-transitory computer-readable data storage medium of claim 3, wherein the shadow array comprises a plurality of shadow units that are each equal or smaller in size as compared to the code units of the original string,
   wherein the single shadow unit indicating that the code unit is invalid is a first prespecified shadow unit that does not encode a value of the code unit,
   and wherein the single shadow unit indicating that the one or more code units that have been processed are valid is a second prespecified shadow unit that does not encode on values of the one or more code units that have been processed.

5. The non-transitory computer-readable data storage medium of claim 2, wherein the processing further comprises, in response to determining that the code unit of the string referenced by the pointer is invalid:
   not appending any code units to the processed string.

6. The non-transitory computer-readable data storage medium of claim 5, wherein the shadow array comprises a plurality of shadow units that are each equal or larger in size as compared to the code units of the original string,
   wherein the single shadow unit indicating that the code unit is invalid is the code unit that is invalid,
   and wherein the single shadow unit indicating that the one or more code units that have been processed are valid is a prespecified code unit that is valid within the encoding scheme, the prespecified code unit not encoding values of the one or more code units that have been processed.

7. The non-transitory computer-readable data storage medium of claim 2, further comprising repeating the processing at determining whether the code unit of the original string referenced by the pointer is valid within the encoding scheme.

8. The non-transitory computer-readable data storage medium of claim 1, wherein processing the one or more code units of the original string comprises:
   decoding the single character encoded by the one or more code units within the encoding scheme;
   converting the single character to a processed character; and
   encoding the processed character within an encoding scheme that is identical to or different than the encoding scheme within which the one or more code units encode the single character,
   wherein the processed character as encoded within the encoding scheme constitute the one or more code units as processed that are appended to the processed string.

9. The non-transitory computer-readable data storage medium of claim 1, wherein processing the one or more code units of the original string comprises:
   decoding the single character encoded by the one or more code units within the encoding scheme;
   appending the single character to a first interim string; and
   generating a placeholder code unit constituting the one or more code units as processed that are appended to the processed string.

10. The non-transitory computer-readable data storage medium of claim 9, wherein the processing further comprises:
    converting the first interim string to a second interim string having a plurality of interim characters equal or greater in number than the first interim string;
    for each interim character of the second interim string, encoding the interim character as one or more interim code units within the encoding scheme of the original string; and
    for each interim character of the second interim string having logical positional correspondence with a respective placeholder code unit of the processed string, replacing the respective placeholder code unit in the processed string with the one or more interim code units within which the interim character has been encoded within the encoding scheme.

11. The non-transitory computer-readable data storage medium of claim 10, wherein the processing further comprises:
    for each interim character of the second interim string not having logical positional correspondence with a respective placeholder code unit of the processed string, appending to the processed string the one or more interim code units within which the interim character has been encoded within the encoding scheme.

12. The non-transitory computer-readable data storage medium of claim 10, wherein the original string is recoverable from the processed string without using the shadow array in a same manner in which the processed string is generated from the original string.

13. A method comprising:
setting, by a processor, a shadow pointer to a first shadow unit of a plurality of shadow units of a shadow array;
setting, by the processor, a string pointer to a first code unit of a processed string encoding characters via a plurality of code units, including the first code unit, within an encoding scheme, the shadow array corresponding to the processed string;
determining, by the processor, whether the shadow unit referenced by the shadow pointer indicates that one or more code units of the processed string beginning with the code unit referenced by the string pointer are valid within the encoding scheme, or whether the shadow unit referenced by the shadow pointer indicates that the code unit referenced by the string pointer is invalid within the encoding scheme;
in response to determining that the shadow unit referenced by the shadow pointer indicates that the one or more code units of the processed string beginning with the code unit referenced by the string pointer are valid:
    starting at the code unit referenced by the string pointer, processing, by the processor, the one or more code units that encode a single character;
    appending, by the processor, the one or more code units as have been processed to an original string;
    advancing, by the processor, the string pointer to the code unit of the processed string following the one or more code units; and
    advancing, by the processor, the shadow pointer to a next shadow unit within the shadow array.

14. The method of claim 13, further comprising, in response to determining that the shadow unit referenced by the shadow pointer indicates that the code unit referenced by the string pointer is invalid:
appending, by the processor, the code unit referenced by the string pointer to the original string without first processing the code unit; and
advancing, by the processor, the string pointer to a next code unit of the processed string; and
advancing, by the processor, the shadow pointer to a next shadow unit within the shadow array,
wherein the shadow units of the shadow array are each equal or smaller in size as compared to the code units of the processed string,
and wherein determining whether the shadow unit referenced by the shadow pointer indicates that one or more code units of the processed string beginning with the code unit referenced by the string pointer are valid within the encoding scheme, or whether the shadow unit referenced by the shadow pointer indicates that the code unit referenced by the string pointer is invalid within the encoding scheme, comprises:
    in response to determining the shadow unit referenced by the shadow pointer is a first prespecified value indicating that the code unit referenced by the string pointer is invalid, the first prespecified value not encoding a value of the code unit, determining the shadow unit indicates that the code unit referenced by the string pointer is invalid; and
    in response to determining the shadow unit referenced by the shadow pointer is second prespecified value indicating that the one or more code units of the processed string beginning with the code unit referenced by the string pointer are valid, the second prespecified value not encoding values of the one or more code units, determining that the shadow unit indicates that the one or more code units of the processed string are valid.

15. The method of claim 13, further comprising, in response to determining that the shadow unit referenced by the shadow pointer indicates that the code unit referenced by the string pointer is invalid:
appending, by the processor, the shadow unit referenced by the shadow pointer to the original string; and
advancing, by the processor, the shadow pointer to a next shadow unit within the shadow array,
wherein the shadow units of the shadow array are each equal or larger in size as compared to the code units of the processed string,
and wherein determining whether the shadow unit referenced by the shadow pointer indicates that one or more code units of the processed string beginning with the code unit referenced by the string pointer are valid within the encoding scheme, or whether the shadow unit referenced by the shadow pointer indicates that the code unit referenced by the string pointer is invalid within the encoding scheme, comprises:
    determining whether the shadow unit referenced by the shadow pointer is a prespecified code unit that is valid within the encoding scheme, the prespecified code unit not encoding values of the one or more code units;
    in response to determining that the shadow unit referenced by the shadow pointer is the prespecified code unit, determining that the one or more code units of the processed string beginning with the code unit referenced by the string pointer are valid; and
    in response to determining that the shadow unit referenced by the shadow pointer is not the prespecified code unit, determining that the code unit referenced by the string pointer is invalid.

16. The method of claim 13, wherein processing the one or more code units comprises:
decoding the single character encoded by the one or more code units within the encoding scheme;
converting the single character to an original character; and
encoding the original character within an encoding scheme that is identical to or different than the encoding scheme within which the one or more code units encode the single character.

17. A system comprising;
a storage device to store:
    an original string encoding characters via a plurality of code units within a encoding scheme;
    a shadow array corresponding to the original string and having a plurality of shadow units, each shadow unit indicating whether a corresponding code unit within the original string is invalid within the encoding scheme or whether corresponding one or more code units within the original string are valid within the encoding scheme;
    a processed string corresponding to the original string;
a processor; and
a memory storing program code executable by the processor to process the original string to generate the shadow array and the processed string.

18. The system of claim 17, wherein the shadow array has logical positional correspondence but not physical positional correspondence with the original string.

19. The system of claim 17, wherein the encoding scheme is an encoding scheme in which there are invalid code units.

20. The system of claim 19, wherein the processed string encodes versions of the characters of the original string within the encoding scheme of the original string,
and wherein the original string is recoverable from the processed string without using the shadow array in a same manner in which the processed string is generated from the original string.

* * * * *